(12) United States Patent
Shih et al.

(10) Patent No.: US 12,501,611 B2
(45) Date of Patent: Dec. 16, 2025

(54) INTEGRATED CIRCUIT DEVICE

(71) Applicant: NANYA TECHNOLOGY CORPORATION, New Taipei (TW)

(72) Inventors: Chiang-Lin Shih, New Taipei (TW); Yu-Ting Lin, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 667 days.

(21) Appl. No.: 17/664,870

(22) Filed: May 24, 2022

(65) Prior Publication Data
US 2022/0285354 A1 Sep. 8, 2022

Related U.S. Application Data

(62) Division of application No. 17/070,938, filed on Oct. 15, 2020, now Pat. No. 11,374,009.

(51) Int. Cl.
*H10B 12/00* (2023.01)
*G11C 5/06* (2006.01)
*G11C 11/407* (2006.01)

(52) U.S. Cl.
CPC ............ *H10B 12/488* (2023.02); *G11C 5/06* (2013.01); *G11C 11/407* (2013.01); *H10B 12/03* (2023.02); *H10B 12/30* (2023.02)

(58) Field of Classification Search
CPC ......... G11C 11/407; G11C 5/06; H10B 12/03; H10B 12/30; H10B 12/34; H10B 12/488
See application file for complete search history.

(56) References Cited

U.S. PATENT DOCUMENTS

| | | | |
|---|---|---|---|
| 2010/0038684 A1* | 2/2010 | Parikh | H10B 10/00 438/129 |
| 2018/0130806 A1* | 5/2018 | Nam | H10B 12/36 |
| 2019/0027582 A1* | 1/2019 | Lee | H10D 64/683 |
| 2020/0373386 A1 | 11/2020 | Chen et al. | |

FOREIGN PATENT DOCUMENTS

| | | |
|---|---|---|
| CN | 111755423 A | 10/2020 |
| TW | I456702 B | 10/2014 |

* cited by examiner

*Primary Examiner* — Britt D Hanley
*Assistant Examiner* — Kevin Quinto
(74) *Attorney, Agent, or Firm* — CKC & Partners Co., LLC

(57) ABSTRACT

A DRAM including a silicon substrate, buried word lines, and active areas is provided. The silicon substrate has a carrier surface. The buried word lines are buried in the silicon substrate. The active areas are located on the carrier surface. The buried word lines intersect the active area. Each of the buried word lines has a first width in one of the active area, and has a second width outside the active areas, and the first width is larger than the second width. A manufacturing method of DRAM is also provided.

20 Claims, 16 Drawing Sheets

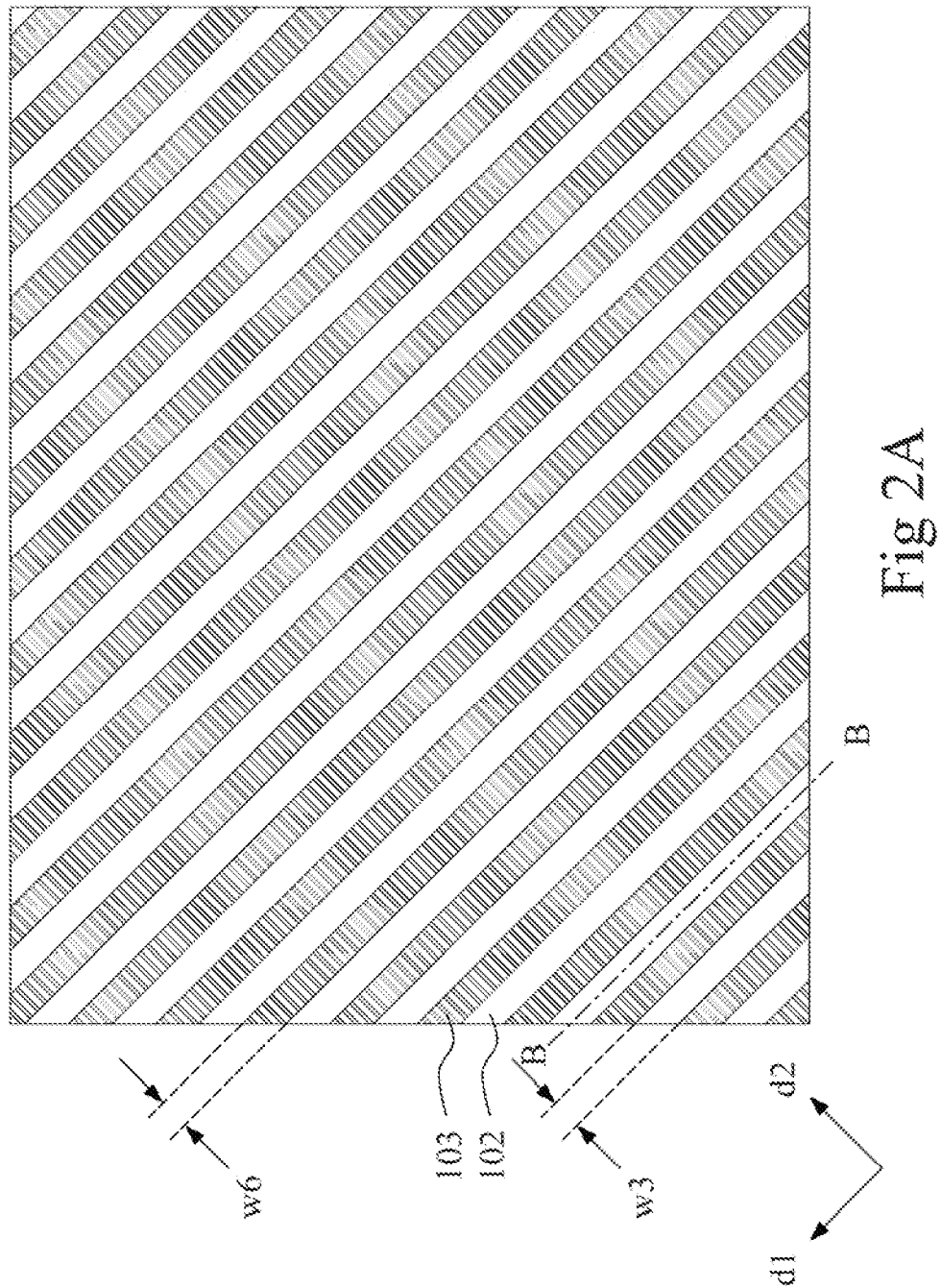

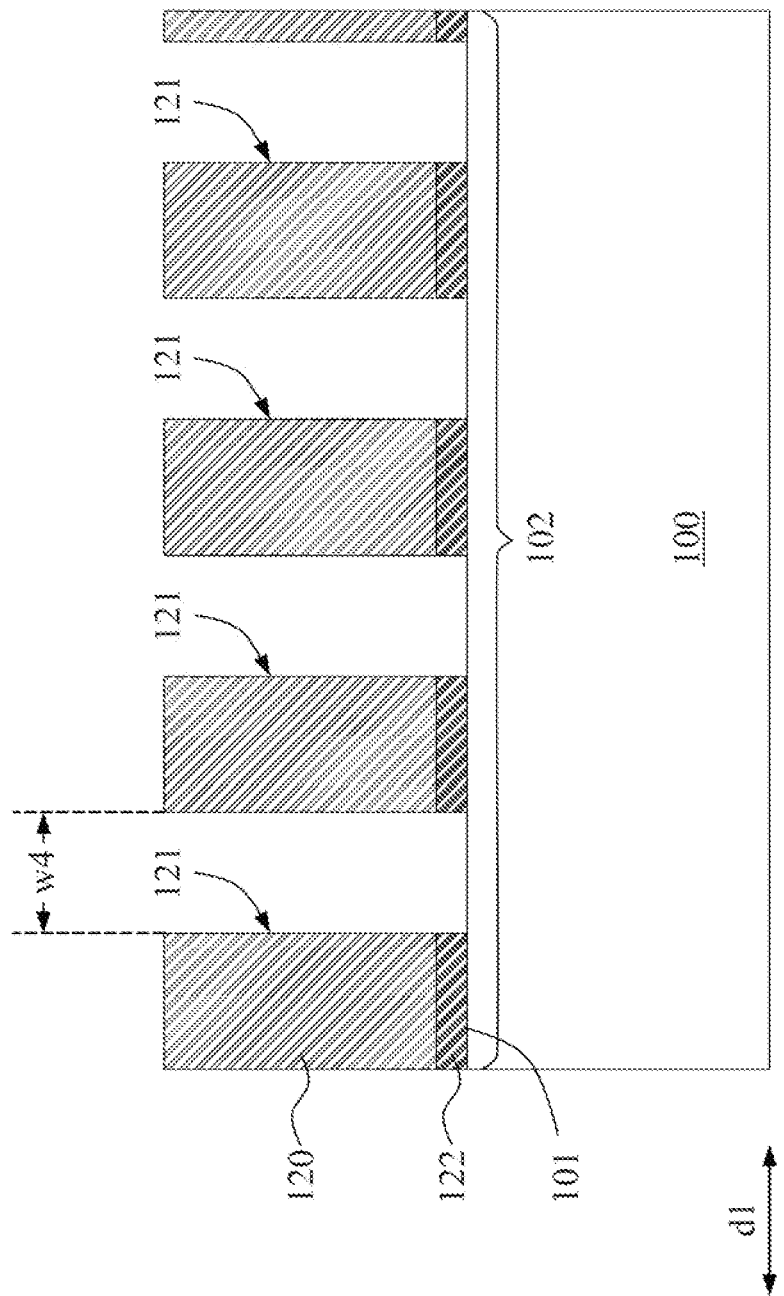

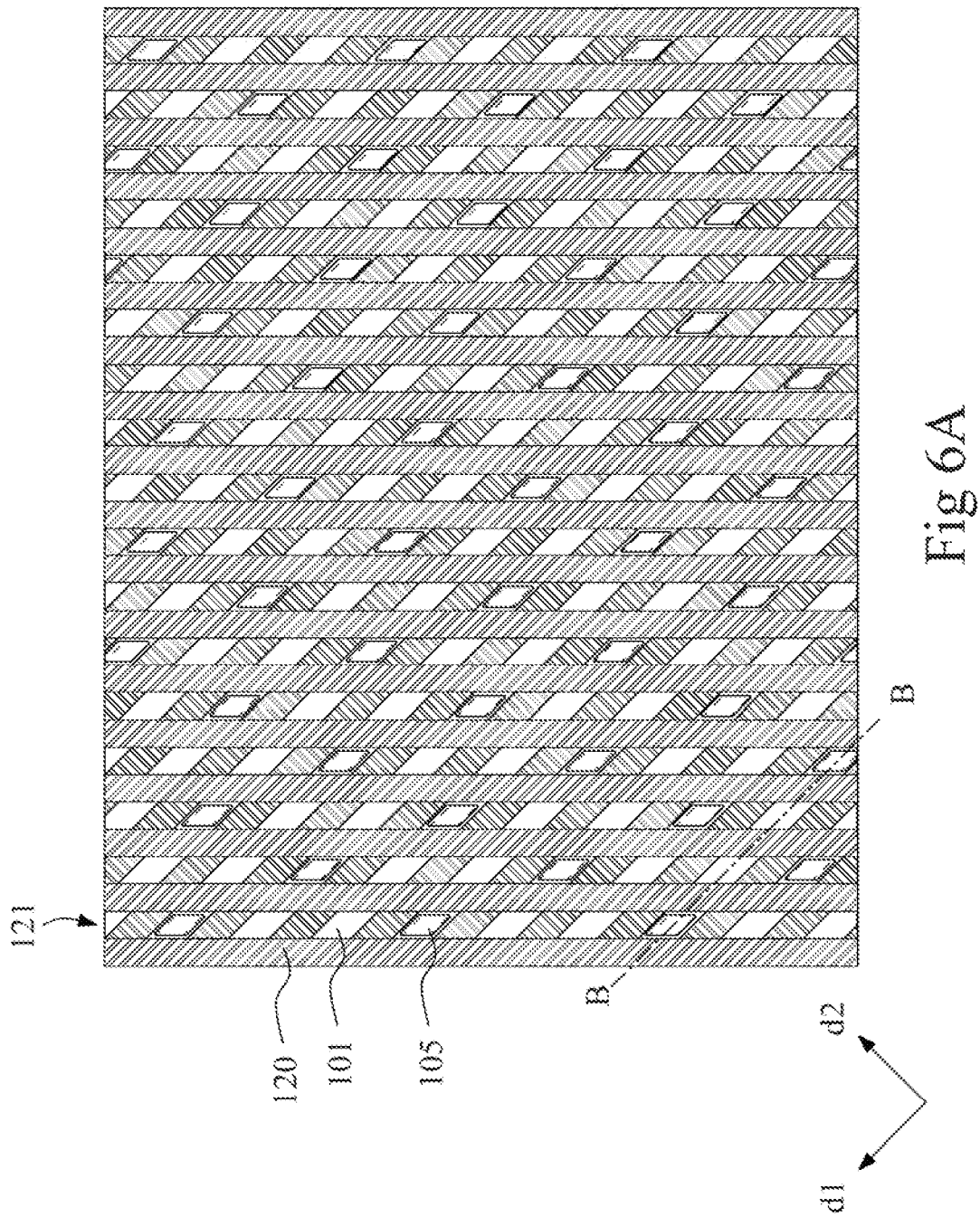

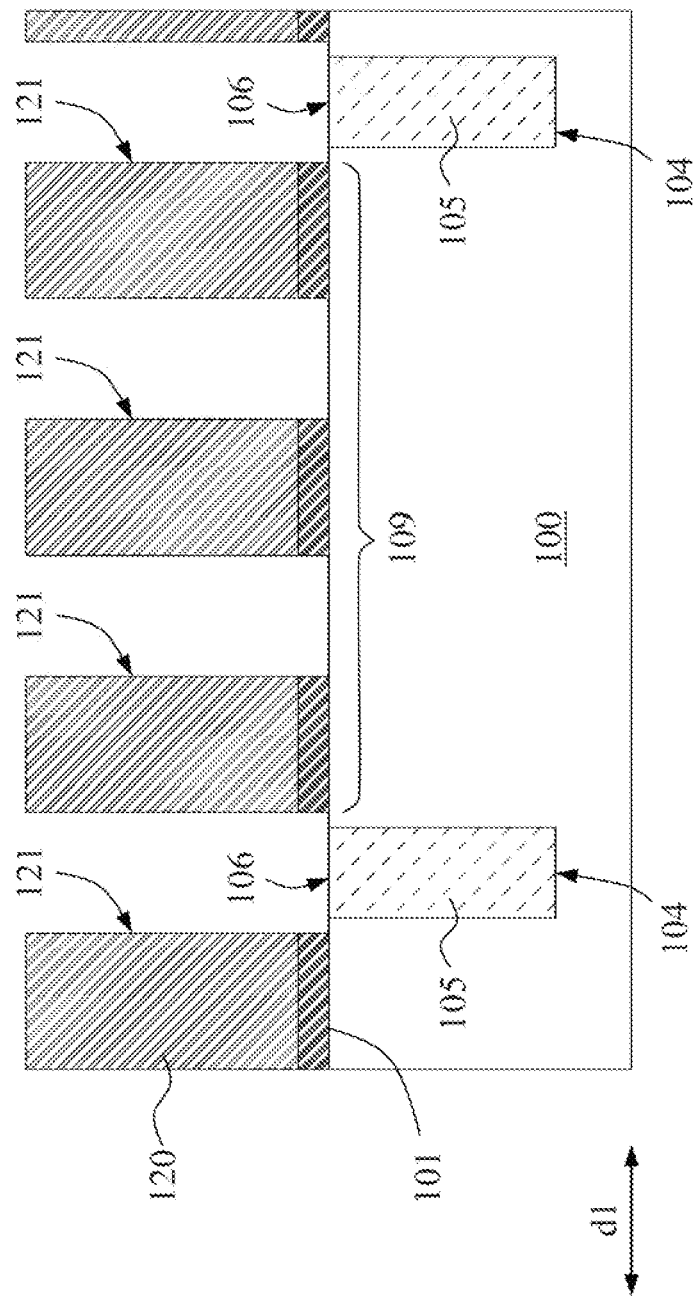

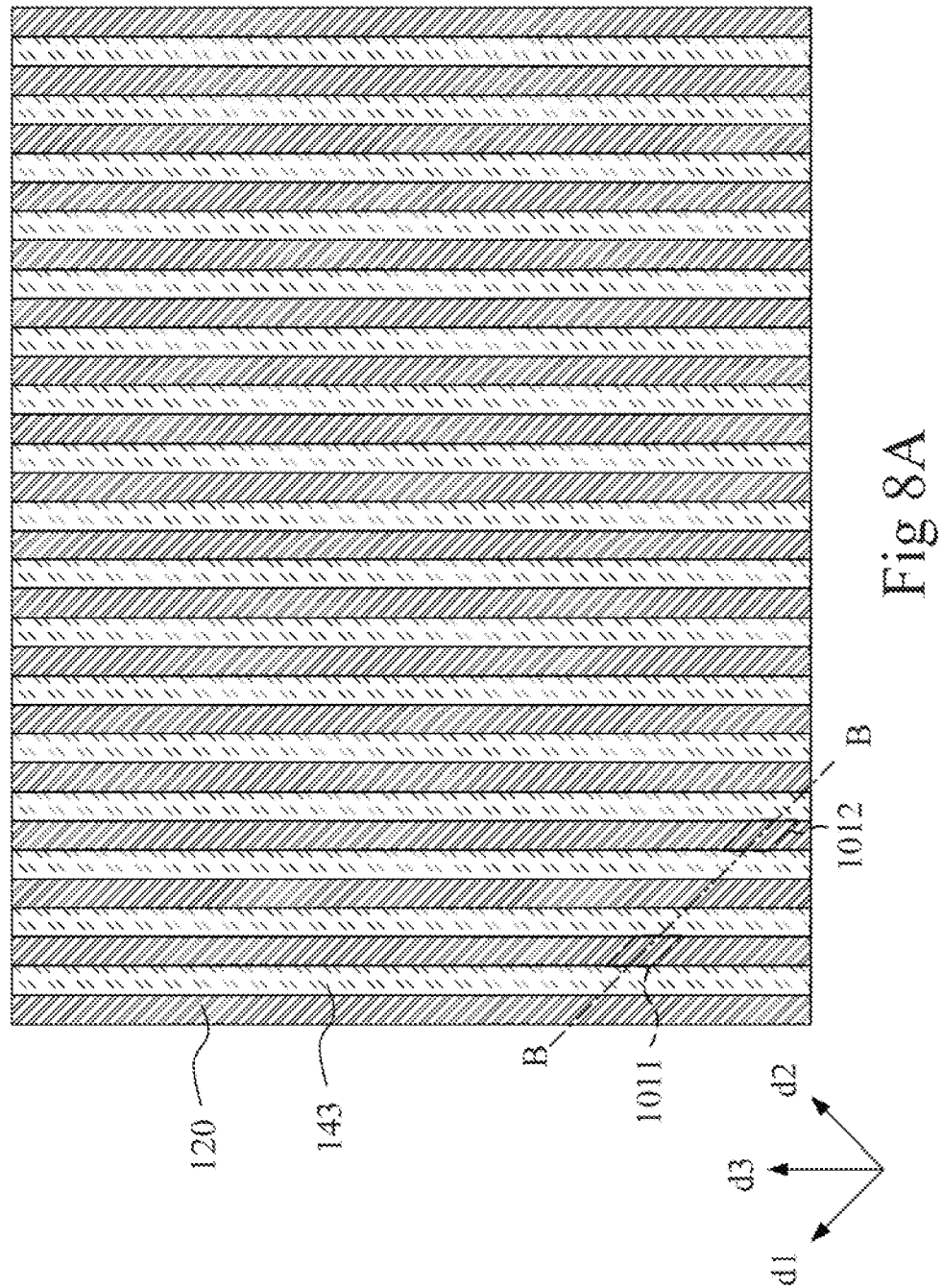

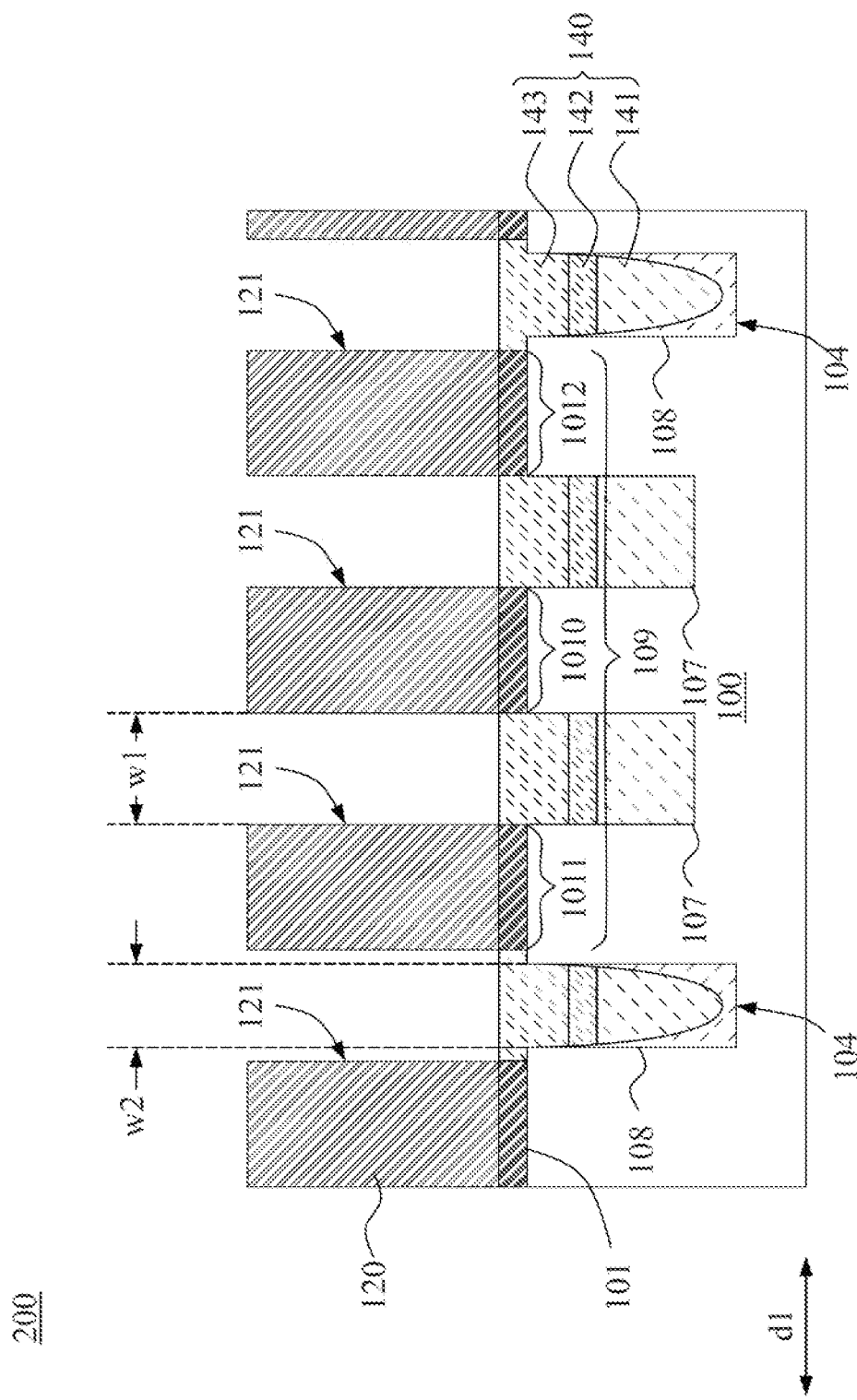

INTEGRATED CIRCUIT DEVICE

RELATED APPLICATIONS

This present application is a divisional application of U.S. patent application Ser. No. 17/070,938, filed on Oct. 15, 2020, which is herein incorporated by reference.

BACKGROUND

Field of Invention

The present invention relates to a dynamic random access memory (DRAM). More particularly, the present invention relates to a DRAM with buried word lines and a manufacturing method thereof.

Description of Related Art

A conventional DRAM cell includes a transistor and a capacitor coupled thereto. When density of the DRAM increases, the channel length of a traditional planar transistor is reduced, causing the short channel effects that include the drain-induced barrier lowering (DIBL), and so forth. Shrinking of the device size reduces the distance between word lines and bit lines, and eventually induces higher parasitic capacitance between such word lines and bit lines.

A buried word line (buried-WL) DRAM structure having word lines buried in the substrate is one of the solutions to deal with the problem. However, when the structure is further scaled down, depth of etching of shallow trench isolation (STI) will vary greatly, and eventually induces word line disturbance after buried word lines are formed.

SUMMARY

Accordingly, the present disclosure provides a DRAM with buried word lines and a manufacturing method thereof.

According to an embodiment of the present disclosure, a DRAM includes a silicon substrate, buried word lines, and active areas. The silicon substrate has a carrier surface. The buried word lines are buried in the silicon substrate. The active areas are located on the carrier surface. The buried word lines intersect the active area. Each of the buried word lines has a first width in one of the active area, and has a second width outside the active areas, and the first width is larger than the second width.

In an embodiment of the disclosure, each of the buried word lines includes at least one conductive structure. Material of the conductive structure includes poly-Si or tungsten.

In an embodiment of the disclosure, each of the active areas includes drain areas and a source area. The source area is located between the drain areas. A shape of each of the drain areas on the carrier surface is parallelogram.

According to an embodiment of the present disclosure, a manufacturing method includes disposing a first hard mask on a carrier surface of a silicon substrate; disposing a second hard mask; etching second trenches on the silicon substrate; etching first trenches on the silicon substrate; and disposing buried word line in the second trenches respectively. The silicon substrate has active strips and isolating strips, and the active strips are disposed on the carrier surface, and the isolating strips divide the active strips. The second hard mask is disposed on the first hard mask. The second trenches are etched on the silicon substrate with second opening of the second hard mask. Oxide structures are disposed in the second trenches respectively before the first trenches are etched. The first trenches on the silicon substrate and third trenches on the oxide structures in the second trenches are etched with first openings of the first hard mask. The second trenches cut the active strips into a plurality of active area.

In an embodiment of the disclosure, each of the buried word lines includes at least one conductive structure. Material of the conductive structure includes poly-Si or tungsten.

In an embodiment of the disclosure, a first area of each of the first openings is smaller than a second area of each of the second openings.

In an embodiment of the disclosure, after the oxide structures are disposed in the second trenches, top surfaces of the oxide structures in the second trenches and the carrier surface are coplanar.

In an embodiment of the disclosure, the active strips are extended along a first direction. A third width of each of the active strips on a second direction is uniform. The second direction is perpendicular to the first direction.

In an embodiment of the disclosure, after the second hard mask is disposed on the first hard mask, the second hard mask fills some of the first openings of the first hard mask.

In an embodiment of the disclosure, the active strips are extended along a first direction. On the first direction, each of the first openings has a forth width, and each of the second openings has a fifth width. The fifth width is larger than the forth width.

With the above-mentioned configuration of the DRAM, word line disturbance and single cell failure may be reduced, and density of the DRAM may be improved.

The foregoing has outlined rather broadly the feature and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purpose of the present disclosure. It should also be realized by those skilled in the art that such equivalent constructions do not depart from the spirit or scope of the disclosure as set forth in the appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIGS. 1A, 2A, 3A, 4A, 5A, 6A, 7A and 8A are schematic plan views of a process of manufacturing a DRAM of an embodiment of the present disclosure; and FIGS. 1B, 2B, 3B, 4B, 5B, 6B, 7B and 8B are schematic sectional views according to cutting plan lines B in FIGS. 1A to 8A respectively

DETAILED DESCRIPTION

Figure 1A:
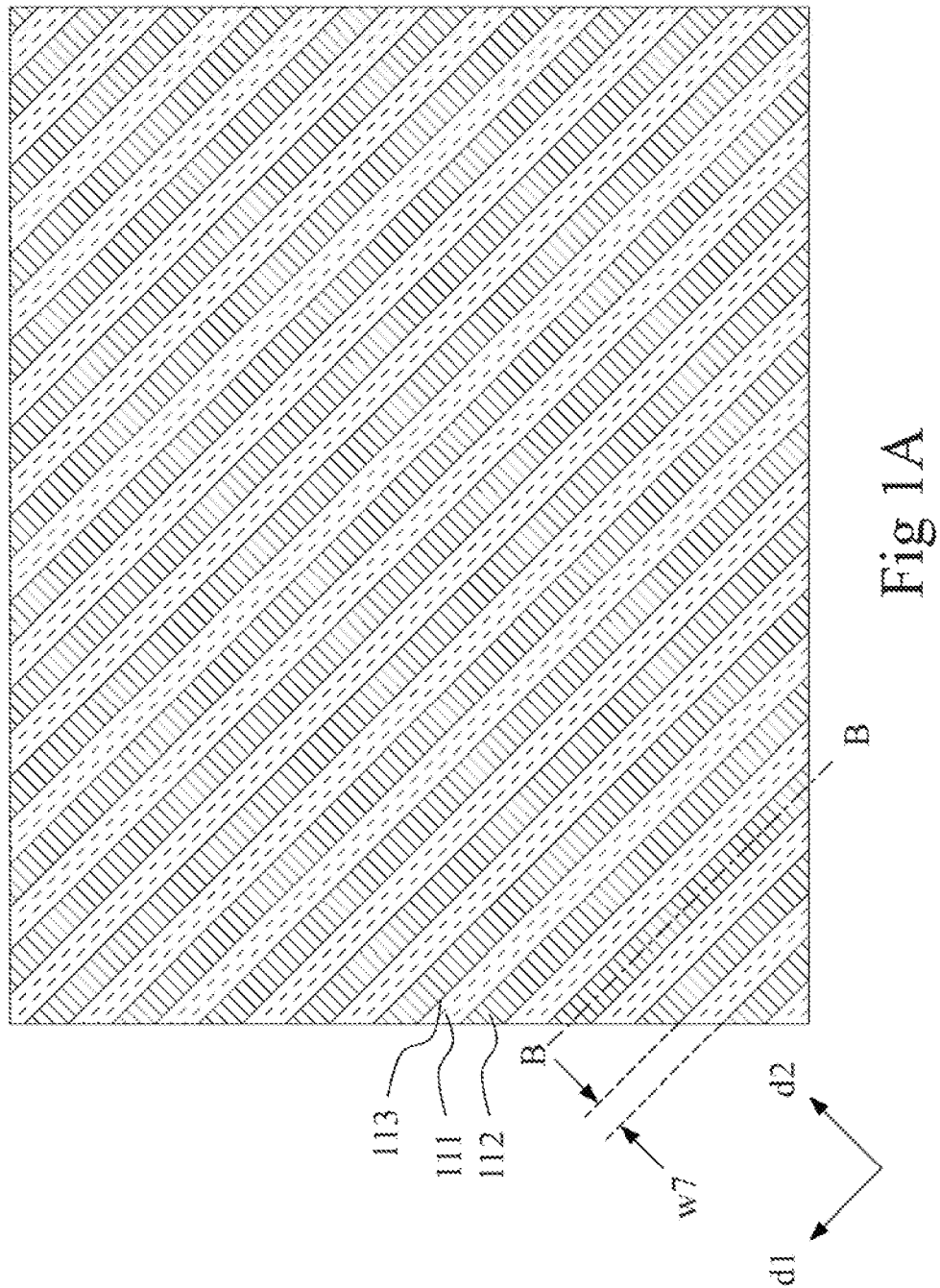

Reference will now be made in detail to the present embodiments of the invention, examples of which are illustrated in the accompanying drawings. Wherever possible, the same reference numbers are used in the drawings and the description to refer to the same or like parts.

It shall be understood that, although the terms first, second, third, etc. may be used herein to describe various elements, components, regions, layers, or sections, these elements, components regions, layers, or sections are not limited by these terms. Rather, these terms are merely used to distinguish one element, component, region, layer, or section from another region, layer or section. Thus, a first element, component, region, layer, or section discussed below could be termed a second element, component, region, layer, or section without departing from the teachings of the present disclosure.

The terminology used herein for the purpose of describing particular embodiments only and is not intended to be limited to the present disclosure concept. As used herein, the singular forms "a", "an" and "the" are intended to include the plural forms as well, unless the context clearly indicates otherwise. It shall be further understood that the terms "comprises" and "comprising", when used in the specification, point out the presence of stated features, integers, steps, operations, elements, or components, but do not preclude the presence or addition of one or more other features, integers, steps, operations, elements, components, or groups thereof.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etching or other removal process. The mask can be a photoresist, or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

FIGS. 1A to 8A are schematic plan views of a process of manufacturing a DRAM of an embodiment of the present disclosure, FIGS. 1B to 8B are schematic sectional views according to cutting plan lines B in FIGS. 1A to 8A respectively, and the cutting plan lines B are parallel with the first direction d1.

Figure 1B:
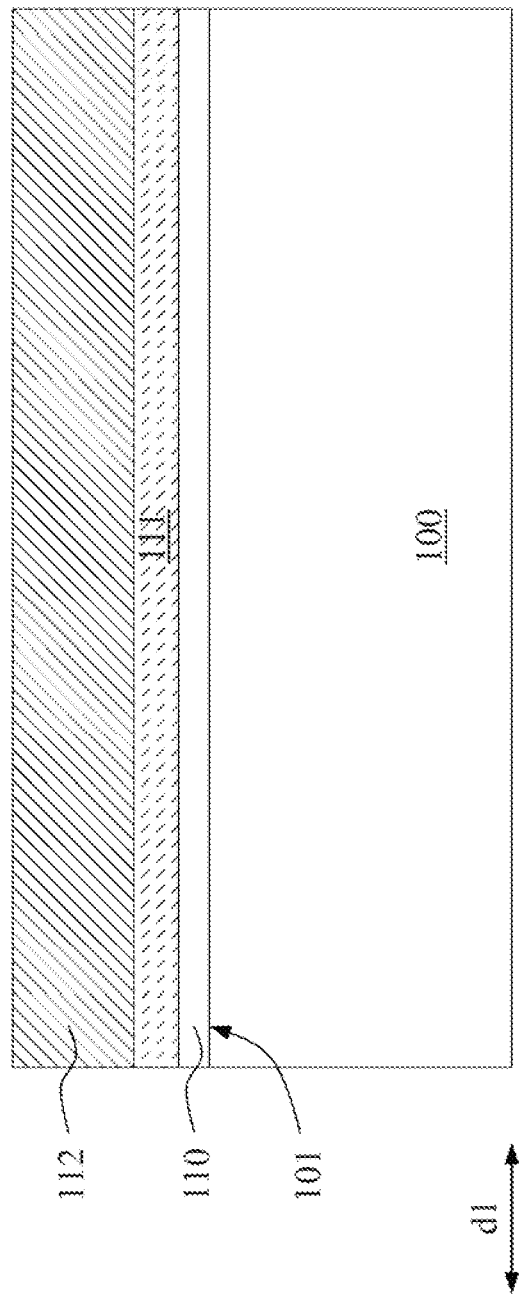

Please refer to FIGS. 1A and 1B, in an embodiment of the present disclosure, the silicon substrate 100 has a carrier surface 101.

For example, in the embodiment, an oxide layer 110 and a nitride layer 111 are disposed on the carrier surface 101 of the silicon substrate 100, and the oxide layer 110 is located between the silicon substrate 100 and the nitride layer 111. Furthermore, a photoresist layer 112 is disposed on the nitride layer 111, and the photoresist layer 112 is patterned, and part of the nitride layer 111 is exposed.

To be specific, the photoresist layer 112 has a plurality of openings 113, and each of the openings 113 is extended along a first direction d1. In a second direction d2, gaps between the openings 113 have width w7. For example, in the embodiment, width w7 of the gap is about 12 nm. However, the present embodiment is not limited thereto; the width w7 of the gap can range from about 10 nm to about 14 nm.

Figure 2B:
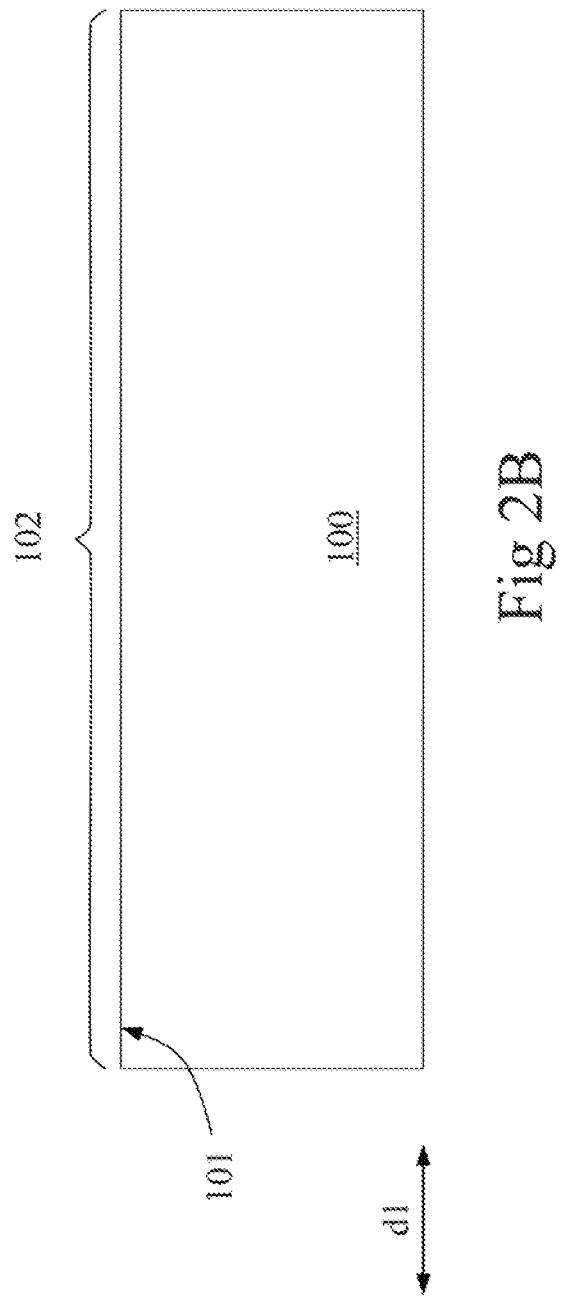

Referring to FIGS. 2A and 2B, parts of the silicon substrate 100 are etched. To be specific, the nitride layer 111 and the oxide layer 110 in FIG. 1B are removed after etching, and remain a plurality of active strip 102 on the silicon substrate 100, and a plurality of isolation strips 103 are disposed among the active strips 102.

The isolation strips 103 divide the active strips 102. In other words, each of isolation strips 103 is disposed between two of the active strips 102.

For example, material of the isolation strips 103 may include oxide, but the present disclosure is not limited thereto.

To be specific, the isolation strips 103 and the active strips 102 are parallel. Furthermore, the isolation strips 103 and the active strips 102 are both extended along the first direction d1, and, in a second direction d2, a third width w3 of each of the active strips 102 is uniform, and the first direction d1 is perpendicular to the second direction d2.

In the embodiment, in the second direction d2, each of the isolation strips 103 has a sixth width w6, and ratio of the third width w3 to the sixth width w6 is about 1.8:1, but the disclosure is not limited thereto. In other embodiment of the present disclosure, the ratio of the third width w3 to the sixth width w6 ranges from about 1.4:1 to about 2.3:1.

Figure 3A:
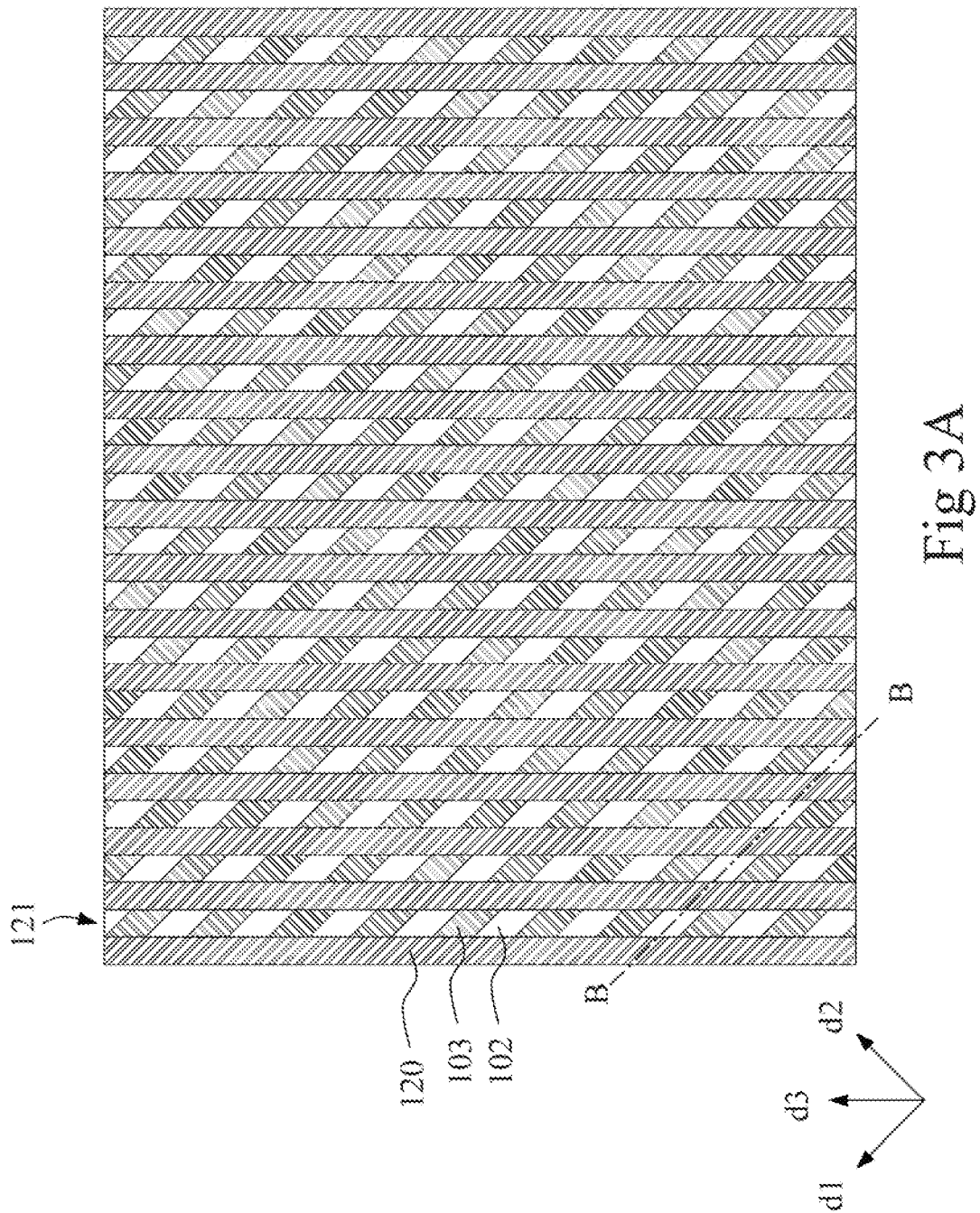

Referring to FIGS. 3A and 3B, a first hard mask 120 is disposed on the carrier surface 101 of the silicon substrate 100. In the embodiment, the first hard mask 120 has a plurality of first openings 121.

Moreover, in the first direction d1, each of the first openings 121 has a forth width w4. For example, the forth width w4 in this embodiment is about 24 nm, but the disclosure is not limited thereto. In some embodiment, the forth width w4 may ranges from about 23 nm to about 25 nm.

To be specific, in the embodiment, while disposing the first hard mask 120, the active strips 102 are parallel and remain uncut. The first openings 121 of the first hard mask 120 overlap with the active strips 102.

For example, in the embodiment, each of the first openings 121 are formed in the shape of strip, and each of the active strips 102 are overlapped with more than one of the first openings 121. The first openings 121 are extended along a third direction d3, and the angle between the first direction d1 and the third direction d3 is an acute angle, and the angle between the second direction d2 and the third direction d3 is an acute angle.

Moreover, an etch hard mask layer 122 may include nitride and silicon, and is disposed between the first hard mask 120 and the carrier surface 101 of the silicon substrate 100 for silicon etch. The distribution area of the first hard mask 120 on the carrier surface 101 and the distribution area of the etch hard mask layer 122 on the carrier surface 101 are substantially the same.

Figure 4A:
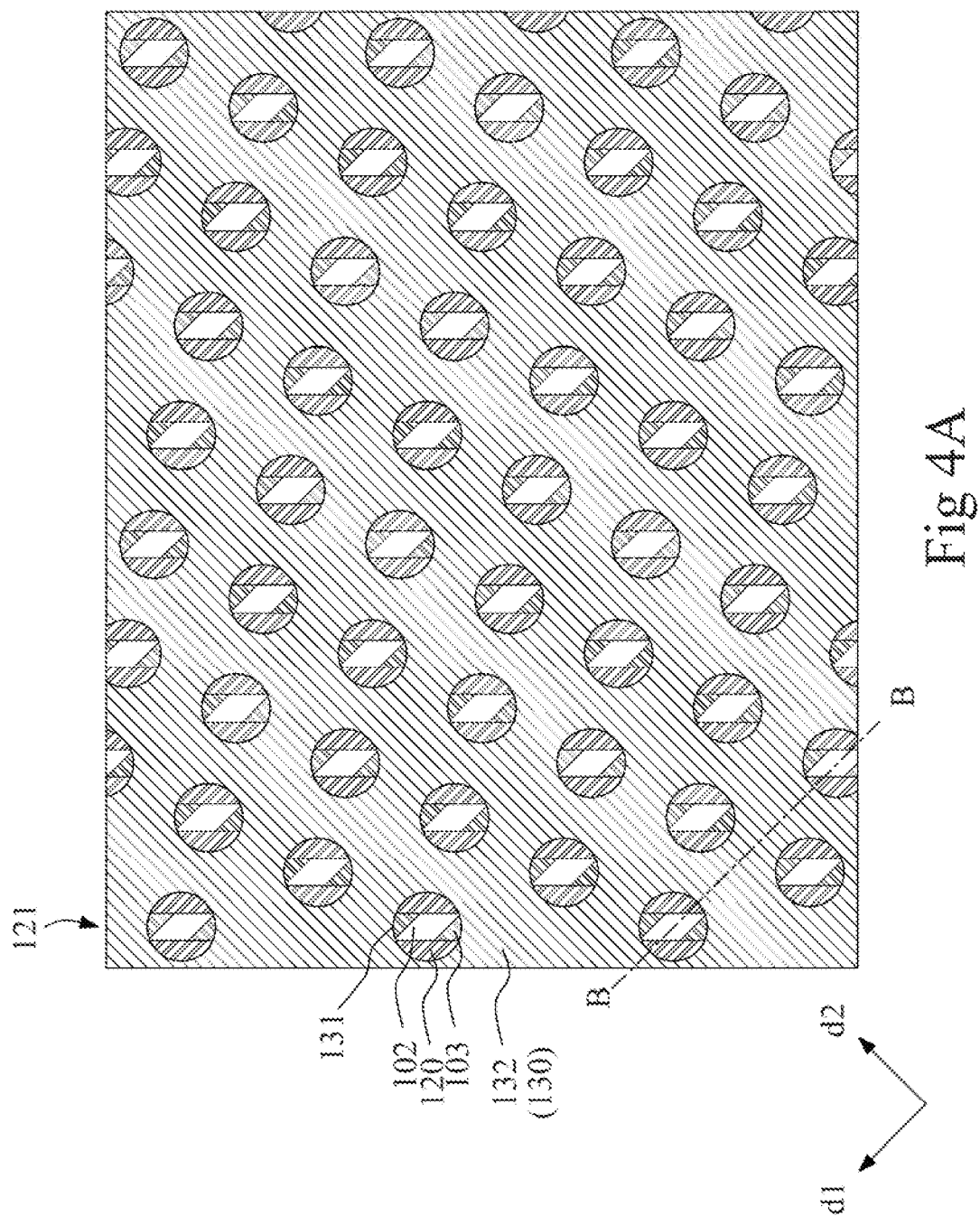
Figure 4B:
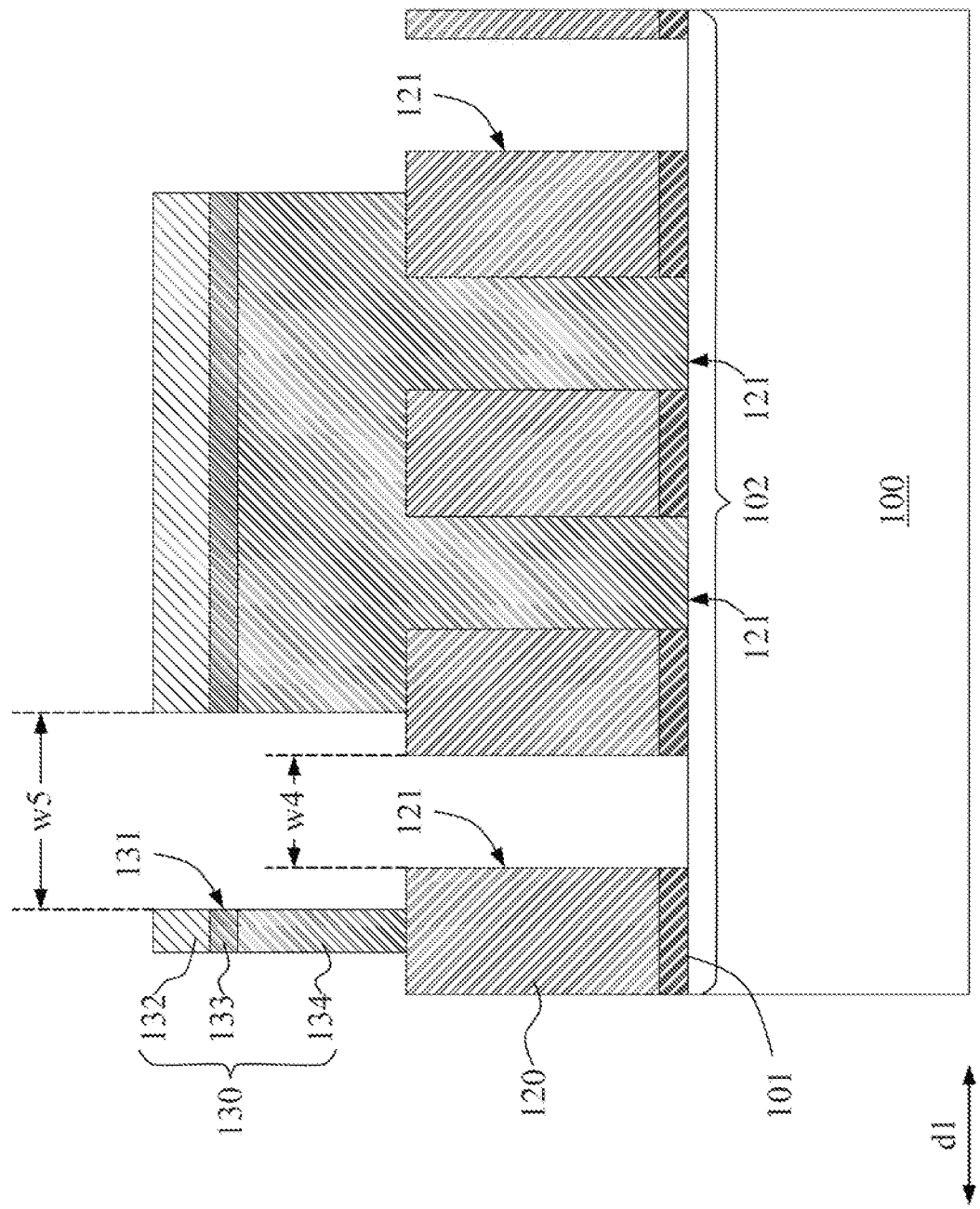

Referring to FIGS. 4A and 4B, a second hard mask 130 is disposed on the first hard mask 120. To be specific, a second hard mask 130 is disposed on the silicon substrate 100 with the first hard mask 120, and some of the first openings 121 are filled with the second hard mask 130. The second hard mask 130 has a plurality of second opening 131, and each of the second openings 131 is aligned with one of the first openings 121 of the first hard mask 120. In other words, each of the second openings 131 exposes one of the first openings 121 of the first hard mask 120.

For example, in the embodiment, the second hard mask 130 has an oxide layer 132, a silicon layer 133, and an under layer 134. The under layer 134 includes organic material for gap fill & uniformity. Each of the second openings 131 goes through the oxide layer 132, the silicon layer 133 and the under layer 134, and is aligned with one of the first opening 121. Some of the first openings 121 are filled with the under layer 134.

Moreover, in the first direction d1, each of the second openings 131 has a fifth width w5, and the fifth width w5 is larger than the forth width w4. For example, the fifth width w5 in this embodiment is about 41 nm, but the disclosure is not limited thereto. In some embodiment, the fifth width w5 may ranges from about 39 nm to about 43 nm.

Also, each of the second openings 131 is formed in the shape of circle. The second openings 131 exposes parts of the active strips 102 defined by the isolation strips 103 and the first hard mask 120.

Figure 5A:
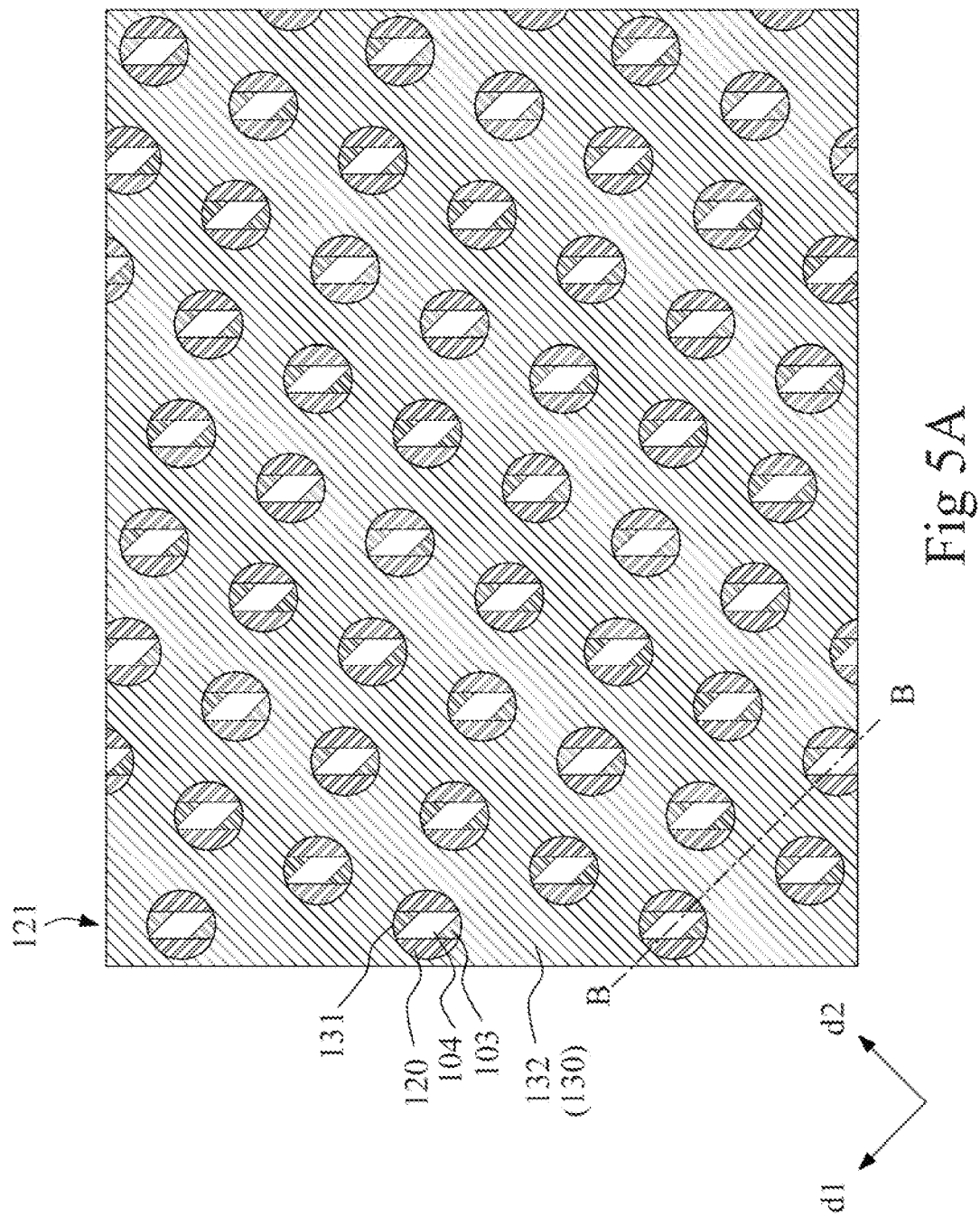
Figure 5B:
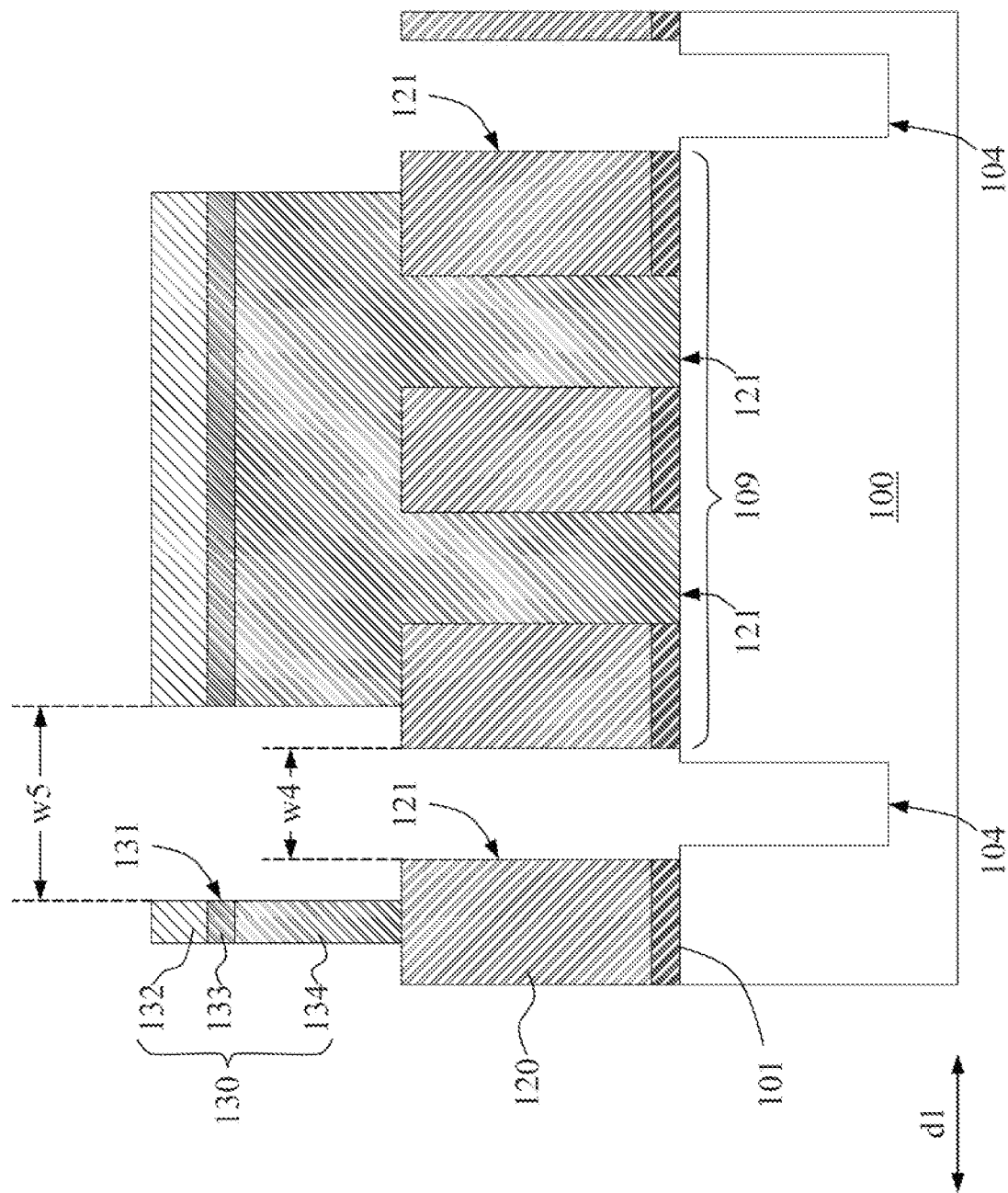

Referring to FIGS. 5A and 5B, the silicon substrate 100 is etched using the second hard mask 130, and a plurality of second trenches 104 are formed. To be specific, the etching removes parts of the active strips 102 of the silicon substrate 100 exposed by the second hard mask 130, the isolation strips 103, and the first openings 121 of the first hard mask 120, and the second hard mask 130 is located above the first hard mask 120. Therefore, the second hard mask 130 further increase the etching depth, and dimension of the second trenches 104 may be thin.

In the embodiment, the second trenches 104 cut the active strips 102 into a plurality of active area 109. In other words, the active areas 109 of the embodiment are divided by the second trenches 104.

Also, the etching of the second trenches 104 and the etching of the isolation strips 103 are performed in different steps. Therefore, the depth of second trenches 104 and the isolation strips 103 may be properly controlled.

Referring to FIGS. 6A and 6B, the second hard mask 130 is removed after a plurality of oxide structure 105 is disposed on the silicon substrate 100. The silicon substrate 100 of the embodiment has the second trenches 104, and the oxide structures 105 are disposed in the second trenches 104 respectively. The first openings 121 of the first hard mask 120 expose the oxide structures 105 and some carrier surface 101 of the semiconductor substrate 100.

For example, in the embodiment, material of the oxide structures 105 may include oxide or oxide with nitride, and top surfaces 106 of the oxide structures 105 and the carrier surface 101 are coplanar.

Figure 7A:
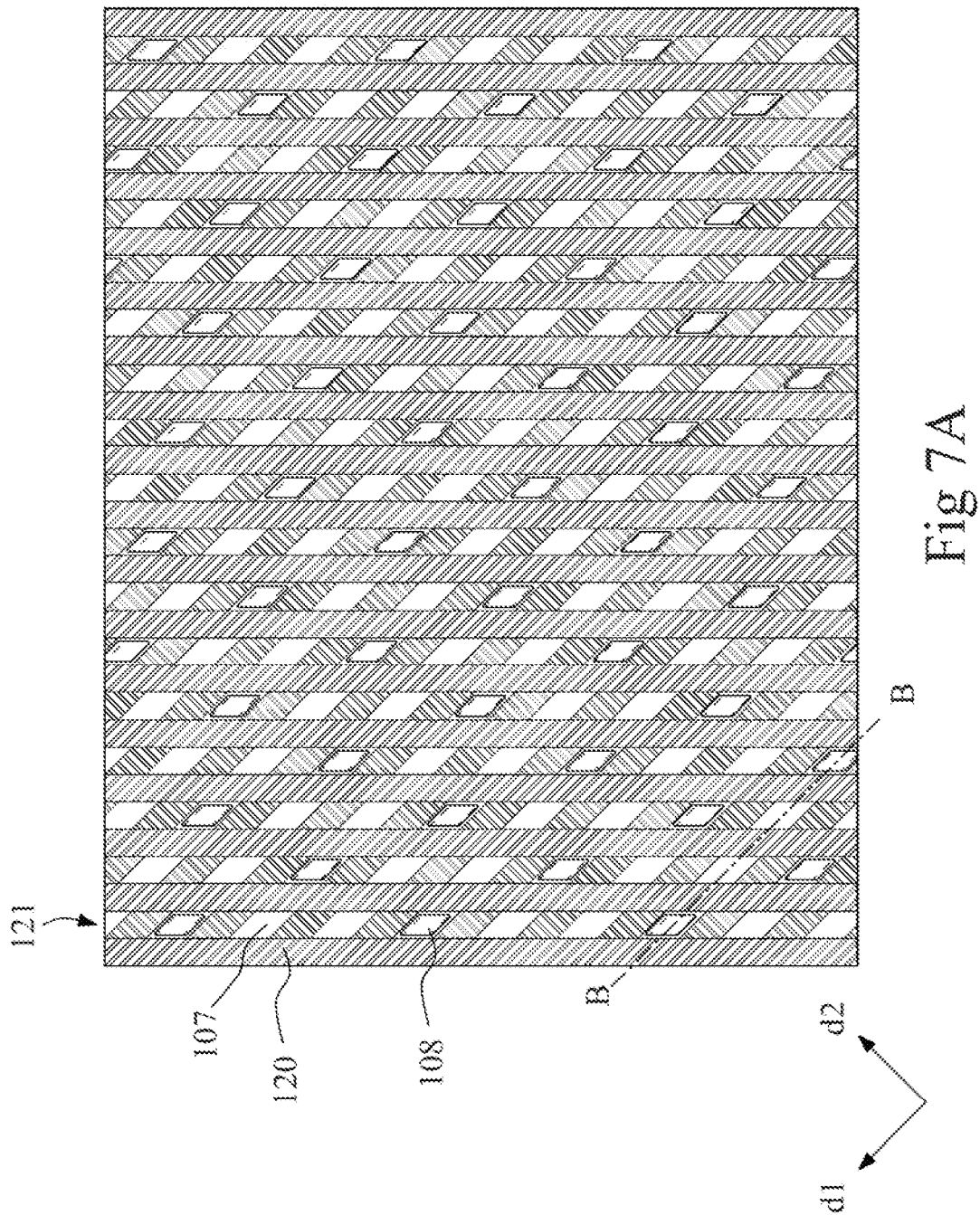
Figure 7B:
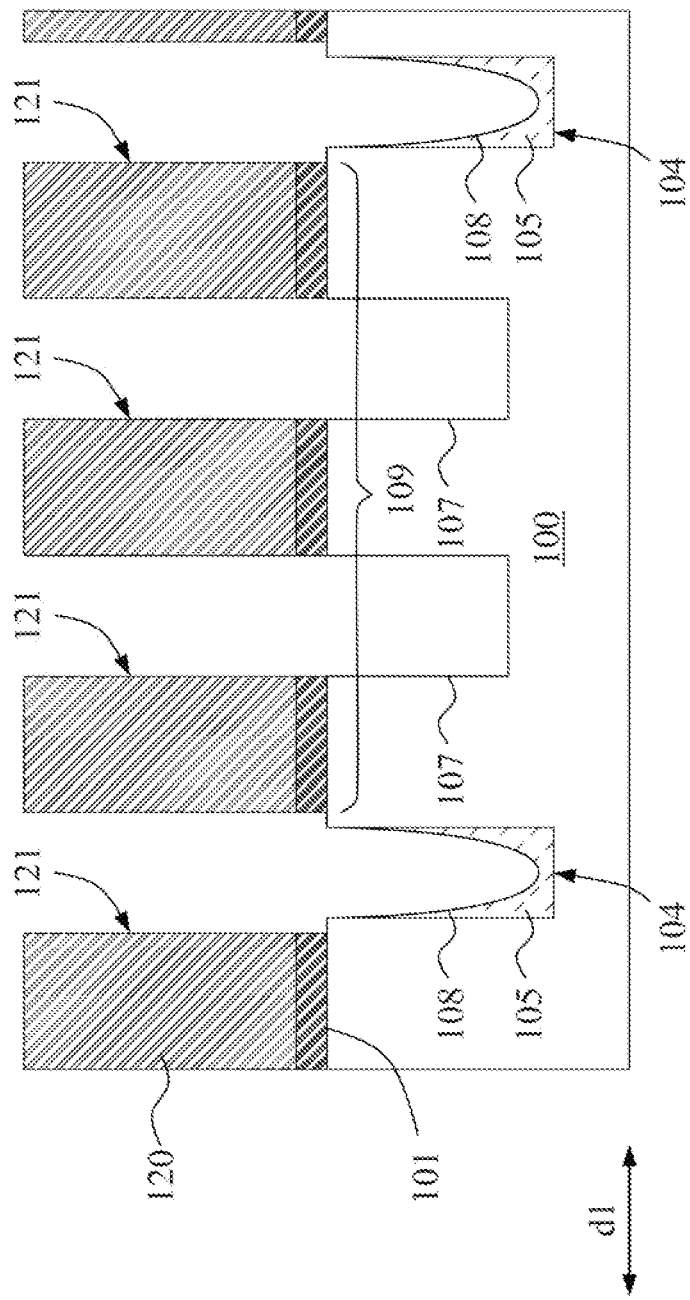

Referring to FIGS. 7A and 7B, the silicon substrate 100 and the oxide structures 105 therein are etched using the first hard mask 120. To be specific, first trenches 107 in the silicon substrate 100 and third trenches 108 in the oxides structures 105 in the second trenches 104 are etched with the first openings 121 of the first hard mask 120.

Referring to FIGS. 8A and 8B, a plurality of buried word line 140 are disposed in the first trenches 107 and the third trenches 108 respectively. To be specific, the buried word line 140 may be disposed along the third direction d3.

To be specific, the buried word line 140 may include conductive structure 141 and conductive structure 142. A nitride layer 143 may cover the conductive structure 142. Material of the conductive structure 141 may include tungsten, and material of the conductive structure 142 may include poly-Si, and material of the nitride layer 143 may include nitride.

The disposition of the buried word line 140 is performed right after the etching of the first trenches 107 and the third trenches 108, and, therefore, the inner surface of the first trenches 107 and the third trenches 108 may be clean before the deposition of the buried word line 140. The buried word lines 140 outside the active areas 109 may perform proper isolation, without inducing current leakage.

Moreover, in the DRAM 200 of the embodiment, the buried word lines 140 intersect the active areas 109, and each of the buried word lines 140 has a first width w1 in one of the active areas 109, and has a second width w2 outside of the active areas 109. The second width w2 is smaller than the first width w1, and density of the active areas 109 may improve.

Also, the active area 109 includes a source area 1010, a drain area 1011, and a drain area 1012. The source area 1010 is located between the drain area 1011 and the drain area 1012, and a shape of each of the drain areas 1011, 1012 on the carrier surface 101 is parallelogram.

In other words, please also refer to FIGS. 5A and 5B, the etching of the second trenches 104 cuts the active strips 102 with a thin and precise manner, and, therefore, the density of active areas 109 may improve, and the shape of the drain areas 1011, 1012 can be parallelogram. Also, the dimension of the drain areas 1011, 1012 can be large, which may further reduce single cell failure while capacitors are disposed.

As seen above, in DRAMs of embodiments of the present disclosure, word line disturbance may be reduced by the buried word line having thin width outside the active areas, and single cell failure may be reduced by the active areas, and, therefore, density of the DRAM may be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this disclosure provided they fall within the scope of the following claims.

What is claimed is:

1. A dynamic random access memory, comprising:
a silicon substrate having a carrier surface;
a plurality of buried word lines buried in the silicon substrate, wherein each of the buried word lines comprises a first conductive structure and a second conductive structure in direct contact with a top of the first conductive structure, and a material of the first conductive structure is different from a material of the second conductive structure;
a plurality of active areas located on the carrier surface, wherein the buried word lines intersect the active areas, and each of the buried word lines has a first width in one of the active areas, and has a second width outside of the active areas, and the first width is larger than the second width;
a plurality of oxide structures disposed in the silicon substrate and outside of the active areas, wherein each of the oxide structures has an inner surface and an outer surface opposite the inner surface, the inner surface is a concave surface in direct contact with a bottom surface of one of the first conductive structures, and the outer surface is in direct contact with the silicon substrate; and
a nitride layer covering the second conductive structure, wherein the nitride layer is in direct contact with a top of the second conductive structure.

2. The dynamic random access memory of claim 1, wherein the material of the first conductive structure comprises tungsten.

3. The dynamic random access memory of claim 1, wherein the material of the second conductive structure comprises poly-Si.

4. The dynamic random access memory of claim 1, wherein a bottom of one of the first conductive structures outside the active areas is lower than a bottom of one of the first conductive structures in one of the active areas.

5. The dynamic random access memory of claim 1, wherein the top of one of the second conductive structures outside the active areas is coplanar with the top of one of the second conductive structures in one of the active areas.

6. The dynamic random access memory of claim 1, wherein the oxide structure is below one of the first conductive structures outside the active areas.

7. The dynamic random access memory of claim 6, wherein the oxide structure tapers from a bottom of the corresponding first conductive structure to the top of the corresponding first conductive structure.

8. The dynamic random access memory of claim 7, wherein one of the second conductive structures outside the active areas has a sidewall in contact with the oxide structure.

9. The dynamic random access memory of claim 1, wherein the top of the first conductive structure is in contact with a bottom of the second conductive structure.

10. The dynamic random access memory of claim 1, wherein each of the active areas comprises:
a plurality of drain areas; and
a source area located between the drain areas, wherein a shape of each of the drain areas on the carrier surface is parallelogram.

11. A dynamic random access memory, comprising:
a silicon substrate having a carrier surface;
a plurality of buried word lines buried in the silicon substrate, wherein each of the buried word lines comprises a first conductive structure and a second conductive structure in direct contact with a top of the first conductive structure, a material of the first conductive structure comprises tungsten, and a material of the second conductive structures comprises poly-Si;
a plurality of active areas located on the carrier surface, wherein the buried word lines intersect the active areas, and each of the buried word lines has a first width in one of the active areas, and has a second width outside of the active areas, and the first width is larger than the second width;
a plurality of oxide structures disposed in the silicon substrate and outside of the active areas, wherein each of the oxide structures has an inner surface and an outer surface opposite the inner surface, the inner surface is a concave surface in direct contact with a bottom surface of one of the first conductive structures, and the outer surface is in direct contact with the silicon substrate; and
a nitride layer covering the second conductive structure, wherein the nitride layer is in direct contact with a top of the second conductive structure.

12. The dynamic random access memory of claim 11, wherein a bottom of one of the first conductive structures outside the active areas is lower than a bottom of one of the first conductive structures in one of the active areas.

13. The dynamic random access memory of claim 11, wherein the top of one of the second conductive structures outside the active areas is coplanar with the top of one of the second conductive structures in one of the active areas.

14. The dynamic random access memory of claim 11, wherein the oxide structure is below one of the first conductive structures outside the active areas.

15. The dynamic random access memory of claim 14, wherein the oxide structure tapers from a bottom of the corresponding first conductive structure to the top of the corresponding first conductive structure.

16. The dynamic random access memory of claim 15, wherein one of the second conductive structures outside the active areas has a sidewall in contact with the oxide structure.

17. The dynamic random access memory of claim 11, wherein the top of the first conductive structure is in contact with a bottom of the second conductive structure.

18. The dynamic random access memory of claim 11, wherein each of the active areas comprises:
a plurality of drain areas; and
a source area located between the drain areas, wherein a shape of each of the drain areas on the carrier surface is parallelogram.

19. A dynamic random access memory, comprising:
a silicon substrate having a carrier surface;
a plurality of buried word lines buried in the silicon substrate, wherein each of the buried word lines comprises a first conductive structure and a second conductive structure in direct contact with a top of the first conductive structure, an entirety of the second conductive structure is above the first conductive structure, and the first and second conductive structures comprise different materials;
a plurality of active areas located on the carrier surface, wherein the buried word lines intersect the active areas, and each of the buried word lines has a first width in one of the active areas, and has a second width outside of the active areas, and the first width is larger than the second width;
a plurality of oxide structures disposed in the silicon substrate and outside of the active areas, wherein each of the oxide structures has an inner surface and an outer surface opposite the inner surface, the inner surface is a concave surface in direct contact with a bottom surface of one of the first conductive structures, and the outer surface is in direct contact with the silicon substrate; and
a nitride layer covering the second conductive structure, wherein the nitride layer is in direct contact with a top of the second conductive structure.

20. The dynamic random access memory of claim 19, wherein a bottom of one of the first conductive structures outside the active areas is lower than a bottom of one of the first conductive structures in one of the active areas, and the top of one of the second conductive structures outside the active areas is coplanar with the top of one of the second conductive structures in one of the active areas.

* * * * *